United States Patent
Lin et al.

(10) Patent No.: US 9,158,867 B2
(45) Date of Patent: Oct. 13, 2015

(54) 2D/3D ANALYSIS FOR ABNORMAL TOOLS AND STAGES DIAGNOSIS

(71) Applicant: Taiwan Semiconductor Manufacturing Co. Ltd., Hsin-Chu (TW)

(72) Inventors: Chun-Hsien Lin, Hsinchu (TW); Jui-Long Chen, Taichung (TW); Hui-Yun Chao, Zhubei (TW); Jong-I Mou, Hsinpu Township (TW); Chin-Hsiang Lin, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 390 days.

(21) Appl. No.: 13/647,643

(22) Filed: Oct. 9, 2012

(65) Prior Publication Data

US 2014/0100684 A1    Apr. 10, 2014

(51) Int. Cl.
*G06F 19/00* (2011.01)
*G06F 17/50* (2006.01)
*G03F 7/20* (2006.01)

(52) U.S. Cl.
CPC ............ *G06F 17/50* (2013.01); *G03F 7/70533* (2013.01); *G03F 7/70616* (2013.01)

(58) Field of Classification Search
CPC ....................................................... G06F 17/50
USPC ......................................................... 700/110
See application file for complete search history.

(56) References Cited

U.S. PATENT DOCUMENTS

| | | | |
|---|---|---|---|
| 6,988,017 B2 | 1/2006 | Pasadyn et al. | |
| 7,174,231 B2 | 2/2007 | Peng et al. | |
| 8,295,965 B2* | 10/2012 | Wu et al. | 700/102 |
| 8,649,990 B2* | 2/2014 | Chu et al. | 702/81 |
| 2011/0257932 A1 | 10/2011 | Chu et al. | |
| 2011/0282480 A1* | 11/2011 | Jang et al. | 700/110 |
| 2012/0016509 A1 | 1/2012 | Wu et al. | |

FOREIGN PATENT DOCUMENTS

| | | |
|---|---|---|
| JP | 2006173373 | 6/2006 |
| TW | 563218 B | 11/2003 |

* cited by examiner

*Primary Examiner* — Robert Fennema
*Assistant Examiner* — Sivalingam Sivanesan
(74) *Attorney, Agent, or Firm* — Eschweiler & Associates, LLC

(57) ABSTRACT

A method for analyzing abnormalities in a semiconductor processing system provides performing an analysis of variance on a production history associated with each of a plurality of tools at each of a plurality of process steps for each of a plurality of processed wafers, and key process steps are identified. A regression analysis on a plurality of measurements of the plurality of wafers at each process step is performed and key measurement parameters are identified. An analysis of covariance on the key measurement parameters and key process steps, and the key process steps are ranked based on an f-ratio, therein ranking an abnormality of the key process steps. Further, the plurality of tools associated with each of the key process steps are ranked based on an orthogonal t-ratio associated with an analysis of covariance, therein ranking an abnormality each tool associated with the key process steps.

18 Claims, 5 Drawing Sheets

2D/3D ANALYSIS FOR ABNORMAL TOOLS AND STAGES DIAGNOSIS

BACKGROUND

In semiconductor manufacturing, semiconductor wafers often undergo many processing steps or stages before a completed die is formed. For example, such processing steps may include lithography, etching, semiconductor doping, and deposition of various materials on the semiconductor wafer. Accuracy and precision of the processing, as well as transitions between different processing steps, often directly impacts the quality of the completed die. For example, misalignment of a gate structure, imprecise doping concentrations, or dielectric layers that are too thick or thin may cause an undesirable amount of leakage current in a transistor or delay in the operation of the circuit.

Further complicating this problem may be a semiconductor manufacturer's desire to maximize the number of dies produced by the processing steps. In an attempt to maximize productivity, a manufacturer may provide many tools for each processing step. However, each tool may have a behavior different from other tools within the particular processing step. Accordingly, determining abnormal tool and stage behavior between different tools in different steps may be difficult.

Conventional methods attempt to diagnose tool and processing stage behavior have existed in one dimension, wherein an analysis of variance (ANOVA) is used to rank suspect tools and/or processing stages. Another one-dimensional diagnosis utilizes a correlation coefficient in order to screen wafer acceptance testing (WAT) or in-line measurements. Such techniques would then be utilized to generate a scatter plot, wherein abnormal tools or stages are manually determined by eye.

SUMMARY

The following presents a simplified summary in order to provide a basic understanding of one or more aspects of the invention. This summary is not an extensive overview of the disclosure, and is neither intended to identify key or critical elements of the invention, nor to delineate the scope thereof. Rather, the primary purpose of the summary is to present some concepts of the disclosure in a simplified form as a prelude to the more detailed description that is presented later.

In one embodiment, the present disclosure relates to a method for analyzing abnormalities in a semiconductor processing system is provided. The method comprises identifying a key process stage from a plurality of process stages based on a parameter of processed wafers. The parameter of processed wafers, for example, comprises a supplied current in the quiescent current—(IDDQ).

A key process step is further identified by determining a probability associated with each of the plurality of process stages and parameter of processed wafers via a statistical regression of the plurality of process stages. The key process stage is further modeled based, at least in part, on the key process stage and key step. An analysis of covariance is further performed based, at least in part, on the modeling of the key process stage. The analysis of covariance defines a t-test associated with the model. Accordingly, a ranking of an abnormality of the key process stage among the plurality of process stages is achieved.

According to one example, identifying the key process stage comprises a statistical regression analysis of the plurality of stages. For example, identifying the key process stage comprises defining a key index based on a correlation coefficient associated with the statistical regression analysis of the plurality of stages. According to another example, the statistical regression analysis comprises a stepwise regression analysis of the plurality of stages. Identifying the key process stage may comprise a statistical analysis of the plurality of stages in two or more dimensions.

Identifying the key process step, for example, may comprise an analysis of variance of the key process stage. Furthermore, an F-ratio associated with the analysis of covariance can be used as a key performance indicator.

DETAILED DESCRIPTION

Figure 1:
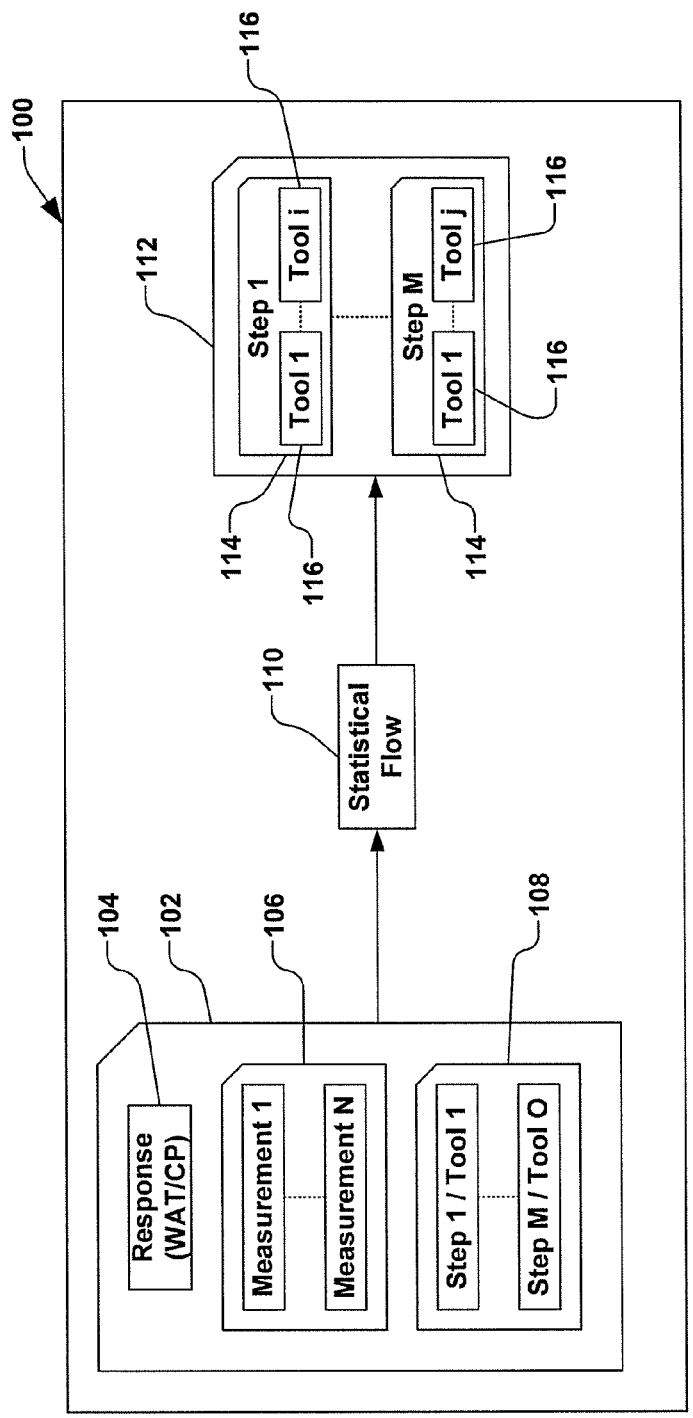
FIG. 1 illustrates a schematic of a methodology according to one exemplary aspect of the disclosure.

The present disclosure provides a multi-dimensional analysis flow in order to rank suspicious tools and processing steps without interference from other correlated factors or influences that may be present, such as processing in one step that may influence measurements in a subsequent step. Accordingly, the present disclosure provides a high-efficiency ranking of tools and processing steps in order of abnormalities evidenced in each respective tool and processing step.

Accordingly, the description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

In accordance with one exemplary aspect of the disclosure, FIG. 1 illustrates a system 100 for semiconductor processing and for performing a method of semiconductor processing control according to one embodiment. The system 100, for example, comprises a computer program product for providing semiconductor processing control. The system 100, for example, is operable to accept input data 102 associated with semiconductor processing a plurality of wafers (e.g., semiconductor workpieces). Each of the plurality of wafers, for example, undergoes a plurality of process steps (e.g., M process steps), such as lithographic processing, etching, semiconductor doping, deposition of various materials on the semiconductor wafer, among other processing. It should be noted that the process steps are also referred to as process stages. Each process step (M), for example, is associated with a plurality of process tools (e.g., i, j, etc.) that are each configured to perform the specific process required for the specified process step. For example, a lithography process step may comprise eight tools (e.g., i=8), an etching step may comprise 5 tools (e.g., j=5), and so on.

The input data 102, for example, comprises response data 104 from wafer acceptance testing (WAT) and circuit performance testing (CP), as well as a plurality of measurements 106 associated with various process steps, such as critical dimension (CD) measurements of various features formed on each wafer. Further, the input data 102 comprises processing step and tool data 108 associated with each of the plurality of process steps and tools utilized in the processing of the plurality of wafers. Accordingly, the input data 102 of the present example comprises production history associated with each of the plurality of tools at each of the plurality of process steps for each of the plurality of processed wafers.

According to another example, a statistical analysis device 110 is provided, such as one or more of a computer analysis device and a modeling device, wherein the statistical analysis device is configured to output suspect ranking data 112, wherein the suspect ranking data comprises a ranking, based on abnormalities determined therein, of suspect process steps 114, as well as a ranking of tools 116.

Figure 2:
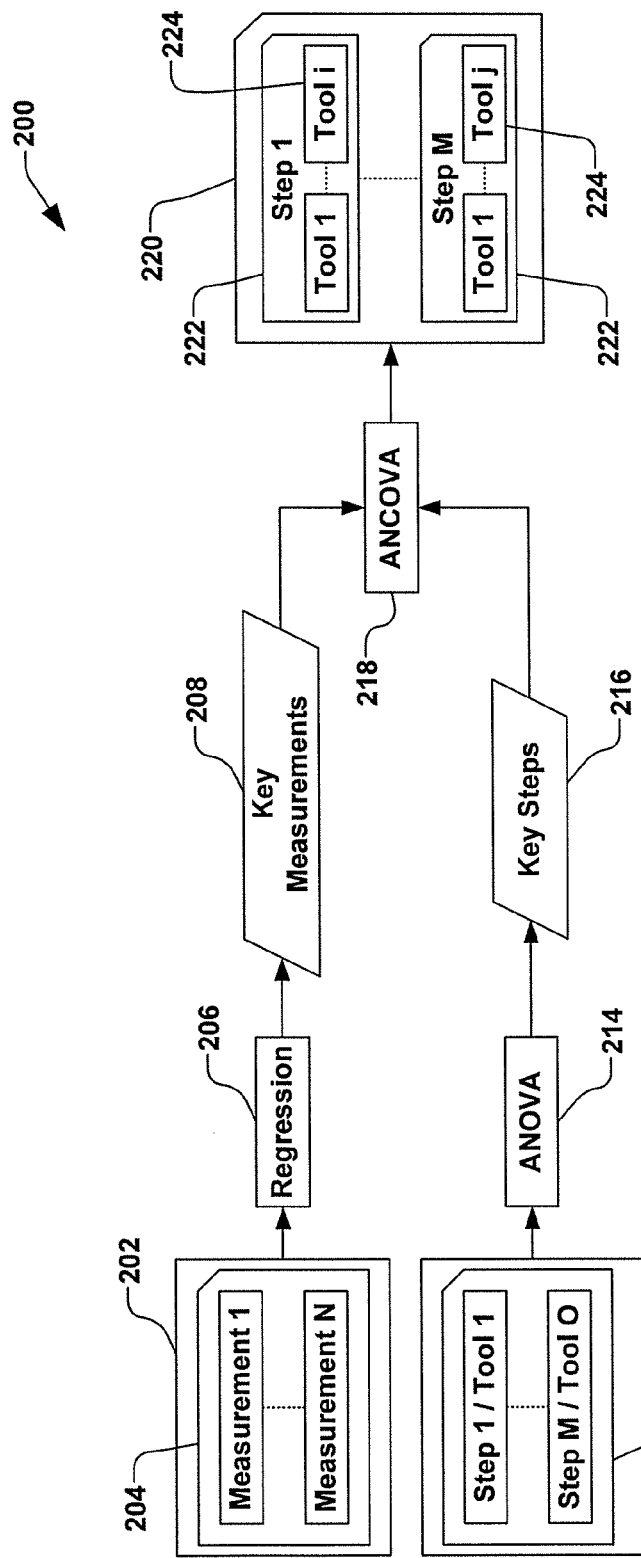
FIG. 2 illustrates another schematic of a methodology according to another exemplary aspect of the disclosure.

In accordance with another exemplary aspect, as illustrated in FIG. 2, a method 200 for analyzing abnormalities in a semiconductor processing system, such as via the system 100 of FIG. 1, is provided. Act 202 of FIG. 2, for example, comprises providing a plurality of measurements 204 associated with the plurality of wafers and/or lots of wafers that have been processed. Processing of the plurality of wafers, for example, comprises the plurality of wafers undergoing a plurality of process steps. Each process step, for example, is associated with a plurality of process tools designed to perform the respective process step. Accordingly, each of the plurality of wafers is processed by one of the plurality of tools associated with each of the plurality of process steps, wherein a particular process step may process multiple wafers utilizing multiple tools associated therewith.

The plurality of measurements 204, for example, may be a part of a production history associated with the processing of the plurality of wafers. Exemplary measurements 204 comprise a quiescent supply current (IDDQ) of a device, saturation current (Isat), or other characteristics of a device or circuit formed on each wafer. Accordingly, the plurality of measurements 204 can be associated with each process tool and/or each process step, and thus may be a part of a production history. It should be noted that various numbers of parameters and/or other measurements 204 may be used in various embodiments of the present disclosure, and all such parameters and measurements are contemplated as falling within the scope of the disclosure.

In act 206, a regression analysis is performed on the plurality of measurements 204, wherein key measurement parameters 208 are identified based on the regression analysis on the plurality of measurements 204. By identifying the key measurement parameters 208 in act 206, process steps or stages and corresponding tools are "screened", such as by using WAT parameters, in order to efficiently analyze large numbers of wafers.

In act 210, production history 212 associated with each of the plurality of tools at each of the plurality of process steps for each of the plurality of processed wafers is further provided. An analysis of variance (ANOVA) is performed on the production history in act 214, wherein key process steps 216 are identified. ANOVA, for example, is one way to judge differences among the plurality of process tools associated with each process step or stage, and/or differences among the plurality of process stages. In each step or stage, for example, a p-value is determined based on ANOVA. One the p-value of all process stages of interest is determined, the plurality of stages can be ranked by p-value, where a small p-value is desired. For example, a p-value of less than 0.05 (e.g., 5%) is used as a basic threshold for stages or steps. Only steps or stages with a p-value<0.05 (or a lower), are thus identified as the key process steps 216 in act 214.

In act 218, an analysis of covariance (ANCOVA) is performed on the key measurement parameters 208 and key process steps 216. The ANCOVA of act 218, for example, may be performed iteratively for each of the key measurement parameters 208 and key process steps 216 in order to quantify the effect of each selected step(s) and corresponding tool(s) with the same key measurement parameter(s) 208 (e.g., WAT) defined in act 206. Regression modeling by ANCOVA may be further performed, wherein each regression model is done separately for each of the key process steps 216, wherein a statistical index can be generated in each regression model. The analysis of covariance, for example, defines a t-test associated with the model. For example, for a specific tool in a specific stage, the modeling may be designed to utilize a plurality of the measured values of IDDQ for wafers and/or lots processed by the specific tool and stage. The model may then create a model for IDDQ using statistical analysis (e.g., linear regression, step regression, etc.) of the plurality of stages. The linear regression, for example, may define IDDQ as a function of saturation current and tools within a specific stage.

Accordingly, an output 220 of the ANCOVA and/or modeling performed on the key process steps of act 218, in one example, provides a ranking the key process steps 222, wherein the ranking is based on an f-ratio associated with the ANCOVA, therein ranking an abnormality of the key process steps. Furthermore, a ranking the plurality of tools 224 is provided by the ANCOVA and/or modeling of act 218, wherein the ranking is associated with each of the key process steps based on an orthogonal t-ratio associated with the ANCOVA, therein ranking an abnormality each tool associated with the key process steps. During each iteration of ANCOVA in act 218, for example, an f-ratio is computed for each key process step, and an orthogonal t-ratio is thus provided for each tool within each key process step. Accordingly, the two indices of f-ratio and orthogonal t-ratio can be utilized to ranking the process steps and tools, respectively.

Figure 3B:
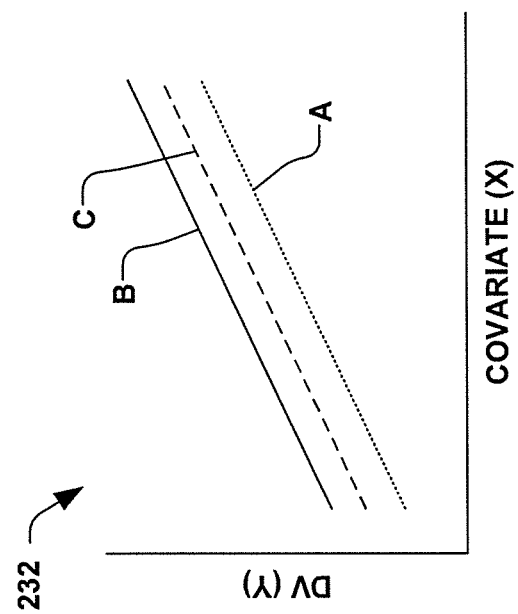
FIGS. 3A-3B illustrate linear regression plots of a plurality of tools in a semiconductor processing system.
Figure 3A:
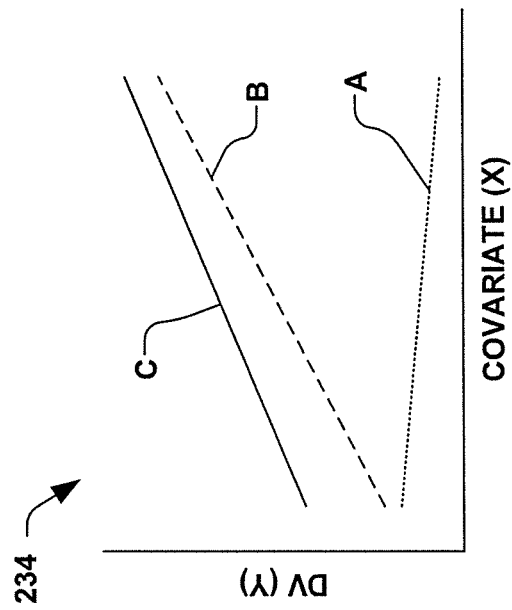

FIGS. 3A and 3B, for example, a illustrate a respective regression plots 230, 232 of three tools (tools A,B,C) associated with a particular step or stage, wherein a covariate is plotted against DV. As illustrated, plot 230 illustrates a situation where no suspicious tools are present, as the plots generally align. However, plot 232 of FIG. 3B clearly illustrates a deviation in tool A, thus determining an abnormality in tool A.

Figure 4:
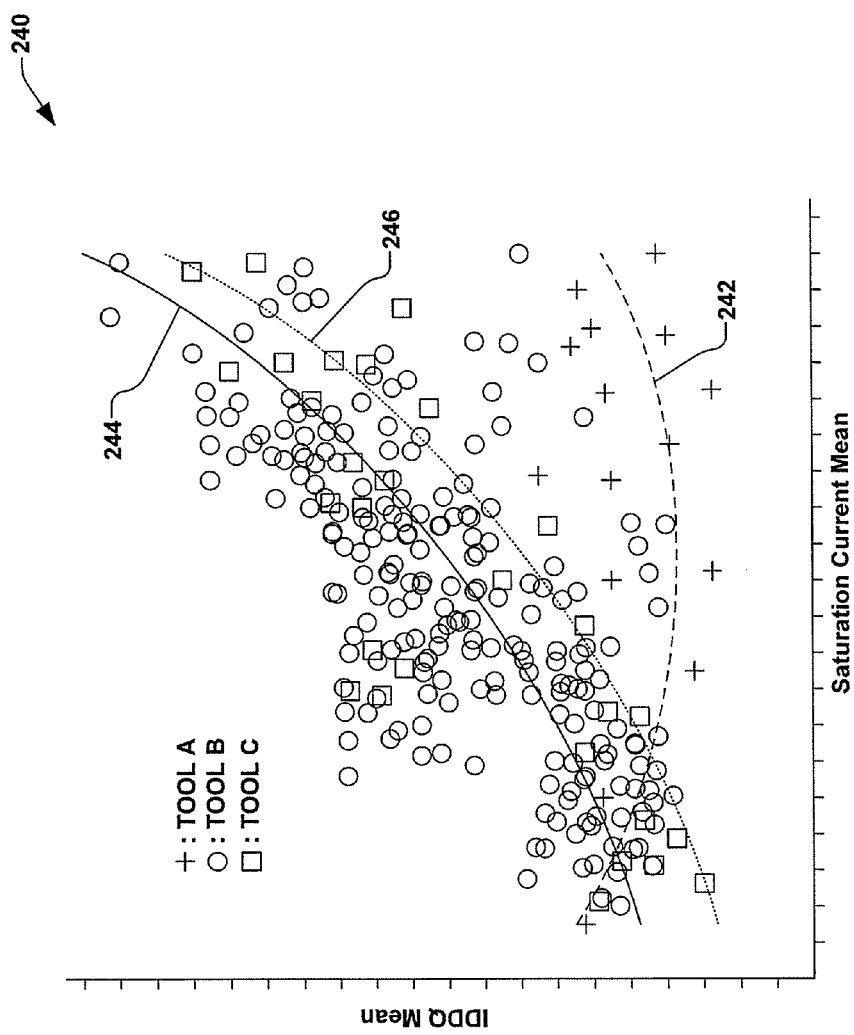
FIG. 4 illustrates another exemplary linear regression plot of a plurality of tools in semiconductor processing system.

FIG. 4 illustrates a regression plot 240 of three tools (tools A,B,C) using actual data associated with a particular step or stage, wherein mean saturation current (Isat) is plotted against mean IDDQ. Quadratic modeling is used between response (IDDQ) and the key WAT parameter (Isat), wherein curves 242, 244, and 236 are derived. As illustrated, curve 242 associated with tool A clearly diverges from the curves 244 and 246 of tools B and C, respectively, therein clearly showing a suspected abnormality in tool A.

Figure 5:
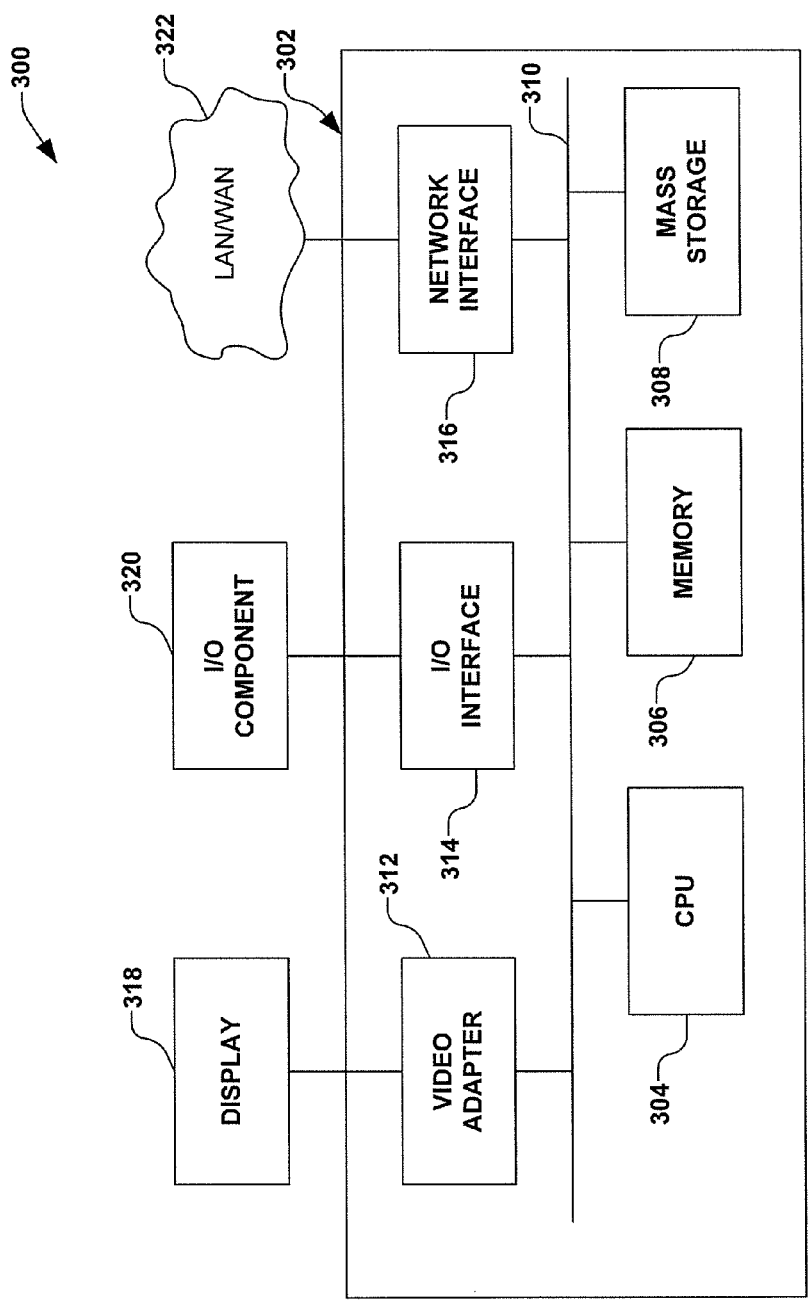
FIG. 5 illustrates a schematic representation of a processor-based system for analyzing abnormalities in a semiconductor processing system.

In accordance with another aspect, the aforementioned methodology may be implemented using computer program code in one or more general purpose computer or processor based system. As illustrated in FIG. 5, a block diagram is provided of a processor based system 300 is provided in accordance with another embodiment. The processor based system 300 is a general purpose computer platform and may be used to implement processes discussed herein. The processor based system 300 may comprise a processing unit 302, such as a desktop computer, a workstation, a laptop computer, or a dedicated unit customized for a particular application. The processor based system 300 may be equipped with a display 318 and one or more input/output devices 320, such as a mouse, a keyboard, or printer. The processing unit 302 may include a central processing unit (CPU) 304, memory 306, a mass storage device 308, a video adapter 312, and an I/O interface 314 connected to a bus 310.

The bus 310 may be one or more of any type of several bus architectures including a memory bus or memory controller, a peripheral bus, or video bus. The CPU 304 may comprise any type of electronic data processor, and the memory 306 may comprise any type of system memory, such as static random access memory (SRAM), dynamic random access memory (DRAM), or read-only memory (ROM).

The mass storage device 308 may comprise any type of storage device configured to store data, programs, and other information and to make the data, programs, and other information accessible via the bus 310. The mass storage device 308 may comprise, for example, one or more of a hard disk drive, a magnetic disk drive, or an optical disk drive.

The video adapter 312 and the I/O interface 314 provide interfaces to couple external input and output devices to the processing unit 302. Examples of input and output devices include the display 318 coupled to the video adapter 312 and the I/O device 320, such as a mouse, keyboard, printer, and the like, coupled to the I/O interface 314. Other devices may be coupled to the processing unit 302, and additional or fewer interface cards may be utilized. For example, a serial interface card (not shown) may be used to provide a serial interface for a printer. The processing unit 302 also may include a network interface 316 that may be a wired link to a local area network (LAN) or a wide area network (WAN) 322 and/or a wireless link.

It should be noted that the processor based system 300 may include other components. For example, the processor based system 300 may include power supplies, cables, a motherboard, removable storage media, cases, and the like. These other components, although not shown, are considered part of the processor based system 300.

Embodiments of the present disclosure may be implemented on the processor based system 300, such as by program code executed by the CPU 304. Various methods according to the above-described embodiments, such as those described with respect to FIGS. 1-4, may be implemented by program code. Accordingly, explicit discussion herein is omitted.

Further, it should be noted that the modules and devices in FIG. 1 may all be implemented on one or more processor based systems 300 of FIG. 5. Communication between the different modules and devices may vary depending upon how the modules are implemented. If the modules are implemented on one processor based system 300, data may be saved in memory 306 or mass storage 308 between the execution of program code for different steps by the CPU 304. The data may then be provided by the CPU 304 accessing the memory 306 or mass storage 308 via bus 310 during the execution of a respective step. If modules are implemented on different processor based systems 300 or if data is to be provided from another storage system, such as a separate database, data can be provided between the systems 300 through I/O interface 314 or network interface 316. Similarly, data provided by the devices or stages may be input into one or more processor based system 300 by the I/O interface 314 or network interface 316. A person having ordinary skill in the art will readily understand other variations and modifications in implementing systems and methods that are contemplated within the scope of varying embodiments.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

While the method(s) provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method for determining abnormal equipment in a semiconductor processing system, the method comprising:
    processing a plurality of wafers, wherein each of the plurality of wafers undergoes a plurality of process steps, and wherein each process step is associated with a plurality of process tools, wherein each wafer is processed by one of the plurality of tools associated with each of the plurality of process steps;

providing production history associated with each of the plurality of tools at each of the plurality of process steps for each of the plurality of processed wafers;

performing an analysis of variance on the production history;

providing a plurality of measurements associated with the plurality of wafers at each process step;

performing a regression analysis on the plurality of measurements;

identifying key measurement parameters based on the regression analysis on the plurality of measurements;

identifying key process steps based on the analysis of variance on the production history;

performing an analysis of covariance on the key measurement parameters and key process steps;

ranking the key process steps based on an f-ratio associated with the analysis of covariance on the key process steps, therein ranking an abnormality of the key process steps; and ranking the plurality of tools associated with each of the key process steps based on an orthogonal t-ratio associated with an analysis of covariance, therein ranking an abnormality each tool associated with the key process steps.

2. The method of claim 1, wherein one of the plurality of measurements associated with the plurality of wafers comprises one or more measurements from wafer acceptance testing (WAT) of processed wafers.

3. The method of claim 1, wherein the key measurement parameters of processed wafers comprise one or more of a quiescent supply current (IDDQ), a saturation current, and a critical dimension (CD) associated with one or more of the process steps.

4. The method of claim 1, wherein identifying the key process steps further comprises ranking a p-value of the plurality of process steps based on the analysis of variance.

5. The method of claim 4, wherein identifying the key process steps comprises selecting process steps having a p-value less than 0.05.

6. The method of claim 1, wherein the statistical regression analysis comprises a stepwise regression analysis of the plurality of the plurality of measurements.

7. The method of claim 1, wherein identifying the key process steps comprises identifying two or more process steps.

8. The method of claim 1, wherein identifying the key measurement parameters comprises identifying two or more measurement parameters.

9. The method of claim 1, wherein the analysis of covariance further comprises a model of the key measurement parameters and key process steps.

10. A computer program product for providing semiconductor processing control, the computer program product having a non-transitory computer-readable storage medium with a computer program embodied thereon, the computer program comprising a computer program code for:

performing an analysis of variance on a production history associated with each of a plurality of tools at each of a plurality of process steps for each of a plurality of processed wafers;

performing a regression analysis on a plurality of measurements associated with the plurality of wafers at each process step;

identifying key measurement parameters based on the regression analysis on the plurality of measurements;

identifying key process steps based on the analysis of variance on the production history;

performing an analysis of covariance on the key measurement parameters and key process steps;

ranking the key process steps based on an f-ratio associated with the analysis of covariance on the key process steps, therein ranking an abnormality of the key process steps; and ranking the plurality of tools associated with each of the key process steps based on an orthogonal t-ratio associated with an analysis of covariance, therein ranking an abnormality each tool associated with the key process steps.

11. The computer program product of claim 10, wherein one of the plurality of measurements associated with the plurality of wafers comprises one or more measurements from wafer acceptance testing (WAT) of processed wafers.

12. The computer program product of claim 10, wherein the key measurement parameters of processed wafers comprise one or more of a quiescent supply current (IDDQ), a saturation current, and a critical dimension (CD) associated with one or more of the process steps.

13. The computer program product of claim 10, wherein identifying the key process steps further comprises ranking a p-value of the plurality of process steps based on the analysis of variance.

14. The computer program product of claim 13, wherein identifying the key process steps comprises selecting process steps having a p-value less than 0.05.

15. The computer program product of claim 10, wherein the statistical regression analysis comprises a stepwise regression analysis of the plurality of the plurality of measurements.

16. The computer program product of claim 10, wherein identifying the key process steps comprises identifying two or more process steps.

17. The computer program product of claim 10, wherein identifying the key measurement parameters comprises identifying two or more measurement parameters.

18. The computer program product of claim 10, wherein the analysis of covariance further comprises a model of the key measurement parameters and key process steps.

* * * * *